United States Patent [19]
Iwasaki

[11] Patent Number: 6,157,197
[45] Date of Patent: *Dec. 5, 2000

[54] AUTO-LOCK TYPE CONTINUITY CHECK UNIT

[75] Inventor: Jo Iwasaki, Yokkaichi, Japan

[73] Assignee: Sumitomo Wiring Systems, Ltd., Yokkaichi, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/028,094

[22] Filed: Feb. 23, 1998

[30] Foreign Application Priority Data

Feb. 24, 1997 [JP] Japan .................................. 9-039448

[51] Int. Cl.$^7$ ........................... H01H 31/04; G01R 31/02
[52] U.S. Cl. ......................... 324/538; 324/754; 324/761; 324/762
[58] Field of Search .................................. 324/538, 539, 324/537, 761, 754, 762; 439/310, 912

[56] References Cited

U.S. PATENT DOCUMENTS

| | | | |
|---|---|---|---|
| 4,902,968 | 2/1990 | Sugimoto | 324/538 |
| 5,335,413 | 8/1994 | Yamamoto | 324/538 |
| 5,498,966 | 3/1996 | Yamamoto | 324/538 |
| 5,614,820 | 3/1997 | Aoyama et al. | 324/538 |
| 5,689,191 | 11/1997 | Kashiyama | 324/538 |
| 5,777,480 | 7/1998 | Hatagishi et al. | 324/538 |

FOREIGN PATENT DOCUMENTS

| | | |
|---|---|---|
| 692718 | 1/1996 | European Pat. Off. . |
| 710847 | 5/1996 | European Pat. Off. . |
| 672909 | 9/1995 | France . |
| 5288792 | 11/1993 | Japan . |
| 2169153A | 7/1986 | United Kingdom . |
| 2170962 | 8/1986 | United Kingdom . |

Primary Examiner—Safet Metjahic
Assistant Examiner—Jermele M Hollington
Attorney, Agent, or Firm—Greenblum & Bernstein, P.L.C.

[57] ABSTRACT

A connector receiving member and a test area are provided in a relatively shiftable manner from an engaged state in which a test area engages in a continuity testable manner to a separated state in which the test area separates from a connector housing. In addition, a drive mechanism is provided for relatively shifting the connector receiving member and the test area in relation to an engaged state and a separated state. The drive mechanism is controlled by a control mechanism. With this mechanism, a connector receiving member and a test area relatively shift to the engaged state upon insertion of the connector housing into the connector receiving member while the connector receiving member and the test area relatively shift to the separated state after a predetermined time period.

17 Claims, 8 Drawing Sheets

AUTO-LOCK TYPE CONTINUITY CHECK UNIT

BACKGROUND OF THE INVENTION

1. Field of the Invention

The present invention relates to an auto-lock style continuity test unit, and more specifically relates to continuity testing for automobile wire harnesses, testing of sub-assemblies (hereinafter referred to as "wire assembly") including a wire harness, or testing between electrical devices.

2. Description of the Related Art

The wire assembly is, in general, an electrical wiring system which forms a predetermined circuit in connection with a plurality of wires. Terminal fittings, which include a male or female type connected with each electric wire, are incorporated in a connector housing, and are protected by a so-called lance type non-slip element. By connecting a connector housing which incorporate a male terminal fitting with one which incorporates a female terminal fitting, electrical connection is achieved between both terminal fittings. The terminal fittings mentioned above are not permitted to slip off from the connector housing with the external force normally applied during use or to encounter a nonconductive failure. Thus, continuity test units have conventionally been proposed to test the electrical continuity or mechanical standstill condition of terminal fittings incorporated in the connector housing.

The continuity test units heretofore proposed have been provided with a housing holder which retains a connector housing, and a test device which carries probe pins to contact the terminal fittings in the retained connector housing. In this case, among the above-mentioned probe pins, a so-called 2 probe-form (which has a switch function and is well known in the art) incorporates a spring member having a capacity allowing a comparatively larger load so as to push off a terminal fitting which is incorrectly loaded into the connector housing, and to allow electrical continuity to be achieved as long as this spring member is deflected a certain distance.

The above-mentioned housing holder and test device are mutually constructed so as to be relatively movable, and the probe pins are brought into contact with the terminal fittings by relatively moving the housing holder and check device using a manual lever, such as a toggle lever.

However, moving the housing holder and test device using a manual lever is undesirable due to poor workability and because it is labor intensive. That being the case, currently so-called auto-lock continuity test units, similar to the invention disclosed below, are mainly proposed which allow continuity testing by positioning a connector housing on probe pins by merely inserting the connector housing to be checked. (See, for example, Japanese Patent Publications (Unexamined) HEI 5288792 and U.S. Pat. No. 5,498,966.)

The structure comprises a connector insertion area for inserting a connector housing to be checked, probe pins mounted inside the connector insertion area, and a connecting tool for connecting the back of the inserted connector, and is arranged to allow the connector to fasten to the connector insertion area by shifting the above-mentioned connecting tool in a direction across the axial direction of the connector at a certain time.

With the above-mentioned prior art, since the probe pins were directly mounted on a connector insertion area, there was a limitation to an adaptable probe pin. That is, provided a 2 probe-form pin as mentioned above was adopted, it was necessary to push the connector housing with the worker's finger force against the control force of a spring member which is provided for the probe pins in case of mounting the connector housing into the connector insertion area. But, since the force required for deflecting a spring member of the probe pins is normally more than 4 kgf, there was the inconvenience of not to be able to insert the connector housing into a connector insertion area with normal worker's finger for such work which required a greater burden on workers.

The present invention was made to overcome the above-mentioned inconvenience, and the object is to provide an auto-lock type continuity test unit not limited to a few probe pins.

SUMMARY OF THE INVENTION

In order to solve the above-mentioned problems, the present invention is directed to an auto-lock type continuity test unit which is provided with a connector receiving member into which a connector housing, which becomes a test object, can be inserted. A test area is provided which contains probe pins for continuity testing of test terminal fittings of a connector housing inserted into a connector receiving member, and a connecting mechanism is provided to fasten the corresponding connector housing in such a manner capable of testing the continuity against the test area with a connector receiving member being shiftable both to a connected state that connects with the back of the connector housing inserted in the connector receiving member and a released state that permits removal of the connector housing from the connector receiving member.

A driving mechanism is provided to relatively shift a connector receiving member and test area between an engaged state and a separated state by moving a connector receiving member and a test area to an engaged state in which the test area engages in a continuity testing manner and to a separated state away from the connector housing.

A control mechanism is provided to control the driving mechanism so that the connector receiving member and the test area move relatively from a separated state at a predetermined time by shifting the connector receiving member relative to the test area to the engaged state as a result of insertion of the connector housing into the connector receiving member.

With the present invention which contains this particular item, when a worker inserts a connector housing into a connector receiving member, insertion of the connector housing can be made without interference between probe pins of the test area and terminal fittings of the connector housing by relatively shifting a connector receiving member and a test area to a separated state. In addition, based on the insertion of the connector housing, since the control mechanism relatively shifts the connector receiving member and test area, the test area engages the retained connector housing and carries out a predetermined continuity test. Furthermore, after the predetermined timing, for example, when a continuity test comes to an end, the control mechanism again controls the driving mechanism, and then relatively returns the connector receiving member and check area. Therefore, the worker can easily remove the connector housing from the connector receiving member. To provide relative movement between the connector receiving member and the check area, any structure, in which either one is fixed while the other shifted, or both are shifted, may be provided.

In addition, with a preferred embodiment, an interlocking mechanism for interlocking the connecting mechanism with the driving mechanism is provided so that the connector housing is locked in the connector receiving member at least when testing, with the connecting mechanism shifted between a connected state and a released state by interlocking with the relative movement between the connector receiving member and the test area.

With the present invention containing this feature, an opening and closing action of the connecting mechanism is achieved by interlocking the relative movement between the connector receiving member and the test area by a driving mechanism.

In addition, with the preferred embodiment of an interlocking mechanism, a link member is included which links the connecting mechanism to the test area so that inserting the connector housing into a connector receiving member is made by maintaining the connecting mechanism in the released state at an initial condition.

With the present invention containing this feature, since the connecting mechanism is moved to a released state at the initial condition by a link member, it is possible to easily insert the connector housing into the connecting receiving member.

In addition, the preferred embodiment of the interlocking mechanism includes a link member which links a connecting mechanism with a testing device so that the connecting mechanism is maintained in a connected state in an initial condition and also the connecting mechanism is allowed to be pushed into a released state by a connector housing to be inserted into the connector receiving member, and a driving mechanism for interlocking capable of driving the link member independently from the driving mechanism.

With the present invention which contains this particular feature, since the connecting mechanism is maintained in a connected state in an initial condition, a worker inserts a connector housing into a connector receiving member by pushing and widening a connecting mechanism from a connected state to a released state. Therefore, the connecting mechanism cannot shift from a widened state to the connected state unless the connector housing is completely inserted into the connector receiving member.

In addition, the link member in another embodiment is provided in a relatively shiftable manner to the test area, so that the connecting mechanism permits shift to a released state when the test area is in a separated state and also the connecting mechanism controls the shift to a released state when the test area is in an engaged state.

With the present invention which contains this particular feature, relatively shifting the link member to the test area allows the connector housing to be detached by shifting the connecting mechanism to a released state in an initial condition. On the other hand, when the test area is in an engaged state, there may be such a case that a significant force is imparted in an extraction direction from the connector receiving member by probe pins or the like in the connector housing. In this case, the connecting mechanism is controlled to shift to a release state, which protects the connector housing from being inadvertently removed from the connector receiving member.

Another embodiment of the present invention is provided with an elastic body capable of controlling the connector housing in a removal direction which is inserted into the connector receiving member.

The present invention which includes this specific feature can eject the connector housing from the connector receiving member by the elastic body. This elastic body, by being provided in the connector receiving member, is structured in a relatively shiftable manner to the test area. Therefore, the contact force by the elastic body can be set to a sufficient level to exclusively eject the connector housing.

According to a first aspect of the present invention, when a connector housing is inserted into a connector receiving member by a worker, insertion of the connector housing is made possible without interference between the probe pins in the test area and the terminal fittings of the connector housing, thus making it possible for the connector housing to be inserted into the connector receiving member without regard to the type of probe pins. Therefore, according to the present invention, either 1 probe-form (which does not have a switch function and which is also well known in the art) style or 2 probe-form style can be easily adopted, thereby achieving remarkable results for minimizing the limitation of probe pins.

Particularly when an interlocking mechanism interlocks a connecting mechanism with a drive mechanism, there is the advantage of being able to perform the continuity testing without the worker being concerned with the connecting mechanism since the connecting mechanism is capable of automatically opening and closing.

In addition, when the connecting mechanism allows the insertion of the connector housing onto a connector receiving member by maintaining the connecting mechanism at a released state in the initial condition, there is the advantage of improving the workability because of the capability for easy insertion of the connector housing into the connector receiving member.

On the other hand, in case the interlocking mechanism contains an interlocking drive mechanism or the like, because it becomes difficult to shift the connecting mechanism to a connected state, unless the connector housing is completely inserted into the connector receiving member, the worker cannot confirm the shift of the connecting mechanism visually or by actual touch, i.e., whether or not the connector housing is completely inserted into the connector receiving member.

Furthermore, the link member allows the connecting mechanism to be shifted to a released state in case the test area is in a separated state, while when the test area is in an engaging state, as if by controlling the shift of the connecting mechanism to a released state, and when the link member is provided to the test area in a relatively shiftable manner, the connector housing can easily be detached when a safety level is assumed and stays constant, thereby providing an advantage of both safety and workability.

In addition, when providing an elastic body for biasing an inserted connector housing in the connector receiving member to a removal direction, because it becomes possible to set a force level that is sufficient to eject the connector housing, and because of the capability to eject the connector housing from the connector receiving member by the elastic body, selection of the elastic body so that the connector housing can most easily be inserted can be chosen, thereby providing the advantage of further improvement of the workability.

BRIEF DESCRIPTION OF THE DRAWINGS

The invention will be described below in detail with reference to the accompanying drawings in which similar elements are indicated by similar reference numerals, and wherein.

DETAILED DESCRIPTION OF THE PREFERRED EMBODIMENTS

Figure 1:
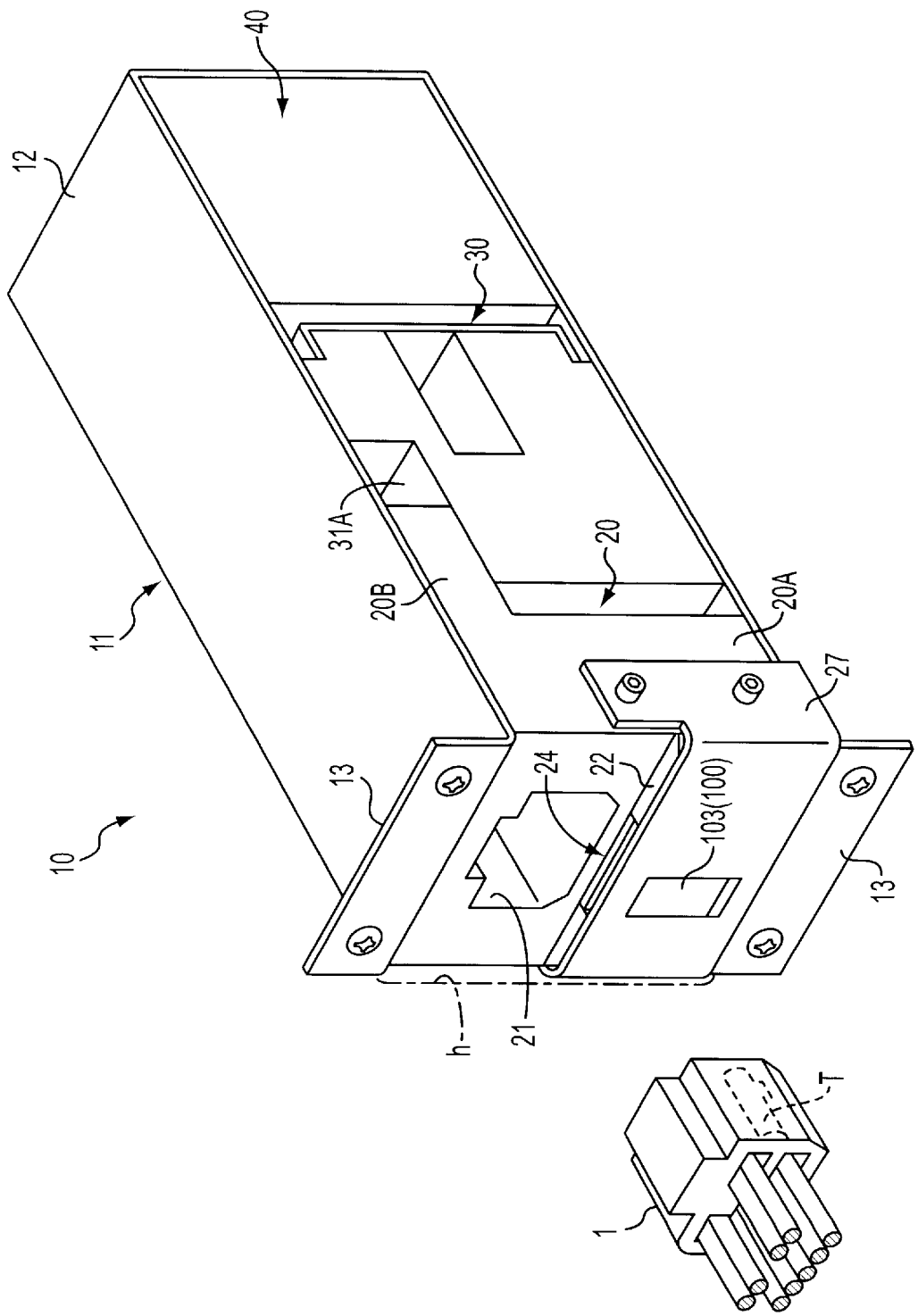
FIG. 1 is a perspective view showing an overall structure of the auto-lock type continuity test unit of the first embodiment of the present invention.

The first embodiment of the present invention will be described with reference to FIGS. 1 and 2. An auto-lock type continuity test unit 10 in the illustrated embodiment is provided with a connector insertion area or connector receiving member 20 and test area 30 on an external plate 11 which forms an outside housing and which is recessed in an exterior plate of a test board (shown in FIG. 1 by phantom mesh).

The above-mentioned outside plate 11 integrally forms a main body 12 which is bent in a substantial U-shape and has mounting flanges 13 formed on opposite sides of the main body 12. The main body 12 is housed within an aperture (as shown in phantom by vertical line h in FIGS. 1 and 2) formed in the above-mentioned exterior plate of the test board, by fitting this flange area 13 on the above-mentioned exterior plate, and also fitting the flange area 13 on the above-mentioned exterior plate by use of small screws, the structure is made in such a way that the connector receiving member 20 is arranged on the surface, with the remainder of the test unit 10 being concealed beneath the exterior plate.

The above-mentioned connector receiving member 20 may be formed by a resin molding which is attached to the main body 12 of the outer plate 11 (by the use of small screws). One side of the connector receiving member 20 includes an insertion opening 21 positioned for receiving the connector housing 1 which is to be a tested object. The insertion opening 21 has a depth substantially equal to the longitudinal dimension of the connector housing so that the connector housing 1 is substantially entirely received within the insertion opening 21. Thus, the connector housing 1, when fully inserted within recess opening 21, has its rear surface positioned substantially flush with the outer surface of the connector receiving member 20 having the insertion opening 21 as seen in FIG. 4(B).

Figure 2:
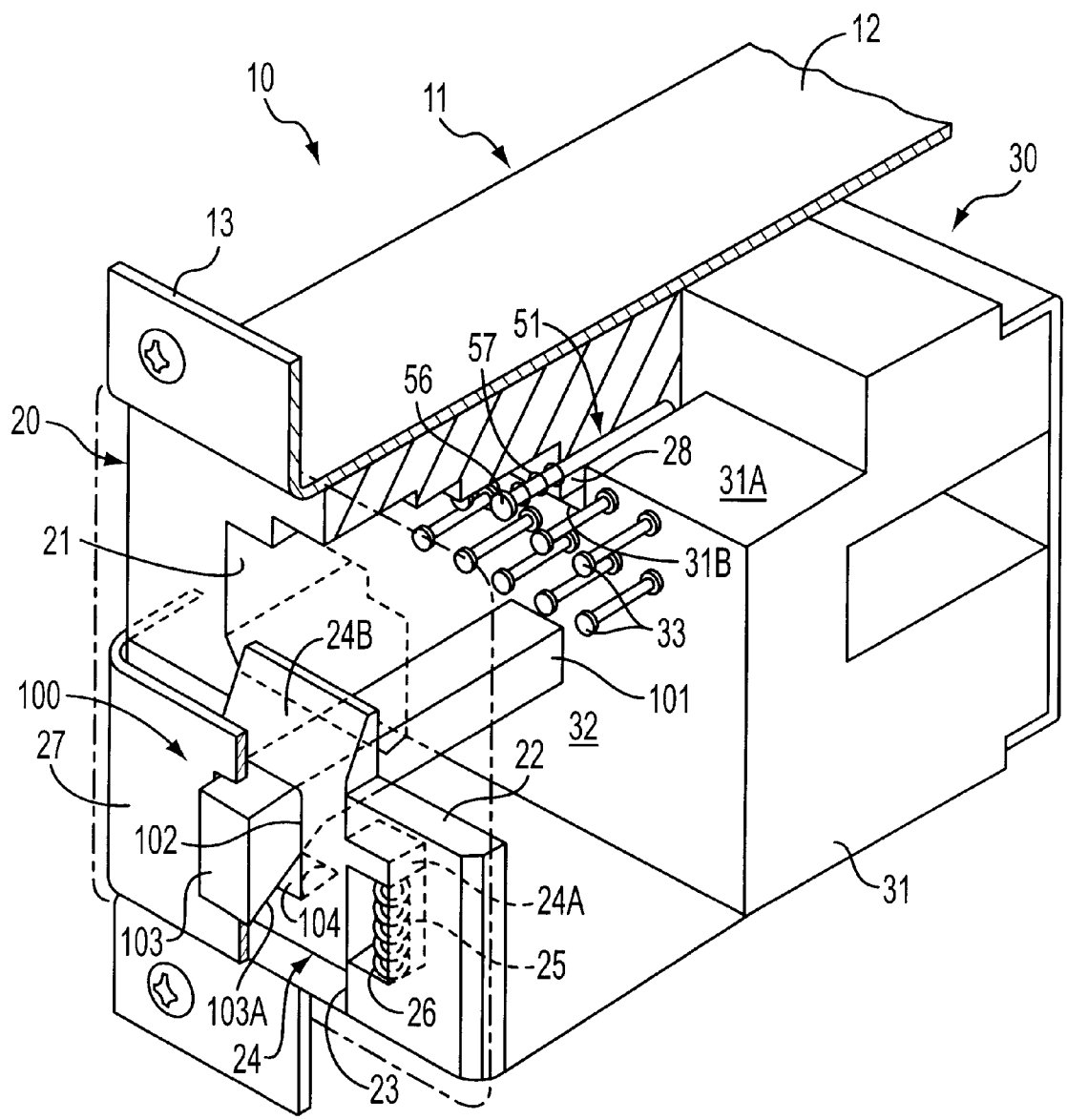
FIG. 2 is a partial cross-sectional perspective view showing details of the auto-lock type continuity test unit in FIG. 1.

Referring to FIG. 2, an upper step area 22 is offset from the outer surface of the connector receiving member 20 which forms the insertion opening 21. At the middle of step area 22, a groove 23 is provided, the inner surface of which is at the same level as the outer surface of the insertion opening 21. The groove 23 extends in the vertical direction as seen in the drawing, and the groove 23 is positioned adjacent the opening of the insertion opening 21 and along a line that intersects therewith. A slider 24 is positioned within the groove 23, and is arranged to slide along the longitudinal direction of the sliding groove 23.

Figure 3A:
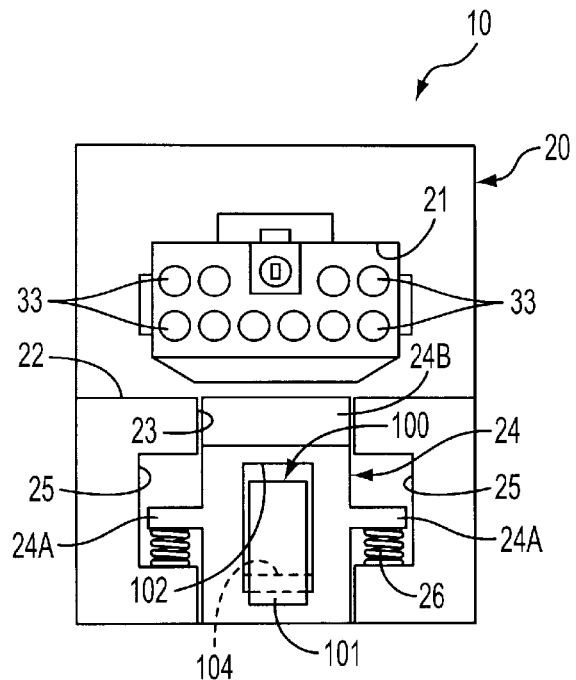
FIG. 3(A) is a schematic partial elevation view of a connector receiving member of the auto-lock type continuity test unit in FIG. 1, which represents a condition in a released state of the slider.
Figure 3B:
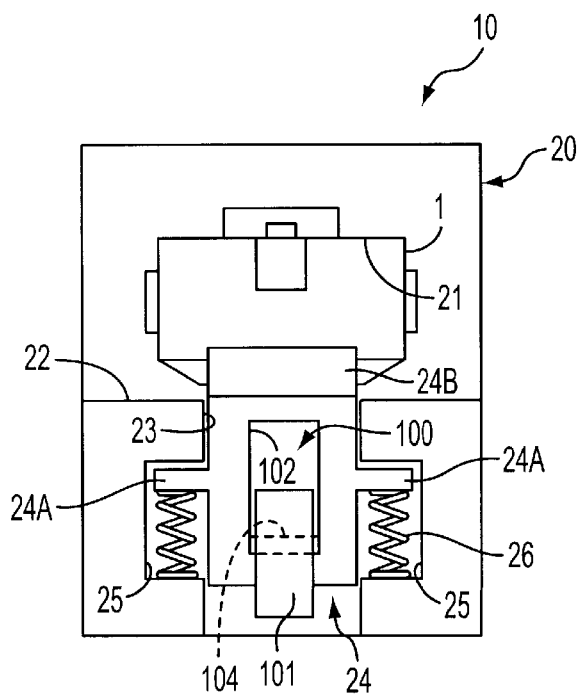
FIG. 3(B) is a schematic partial elevation view of a connector insertion area of the auto-lock type continuity test unit in FIG. 1, which represents a condition in a connected state.

With reference to FIGS. 2, 3(A) and 3(B), the slider 24 is formed as a substantially rectangular resin plate and is provided on opposite sides thereof with a pair of arms 24A formed integrally therewith. A recessed area 25 is provided on opposite sides of the groove 23, in cooperation with each arm 24A, which controls the stroke of up and down movement of the slider 24. The slider 24 is movable both to a connected condition which partially closes the upper part of insertion opening 21 as shown in FIG. 3(B) by movement toward the upper direction within the range controlled by the recessed area 25 and to a released condition which fully releases the insertion opening 21 as shown in FIG. 3(A). In this embodiment, the upper front area of the slider 24 is chamfered so that the upper edge gradually becomes thinner thereby providing a guide surface 24B. Therefore, with this guide surface 24B, insertion of the connector housing 1 is easily accomplished.

Furthermore, a compression coil spring 26 is provided between the underside of arms 24A and the bottom of the recessed areas 25. Thus, the compression coil springs 26 constantly bias the slider 24 toward the connected condition via the arms 24A.

With the embodiment illustrated, the front of the above-mentioned step 22 is covered with a plate 27 formed to have a U-shape. This cover plate 27 is attached to the connector receiving member 20 by small screws (not numbered, FIG. 1) and the cover plate 27 protects steps 22, and prevents removal of the compression coil springs 26 and the slider 24.

As illustrated in FIG. 1, the connector receiving member 20 is integrally formed with a base area 20A which includes the insertion opening 21 and a projection 20B which projects towards the rear of the main body 12 from the upper edge of the base area 20A. On the central part of lower area of the projection 20B, a rib 28 is formed (refer to FIGS. 2, 4(A) and 5) for mounting a spring pin unit 51, the description of which will follow.

Figure 4A:
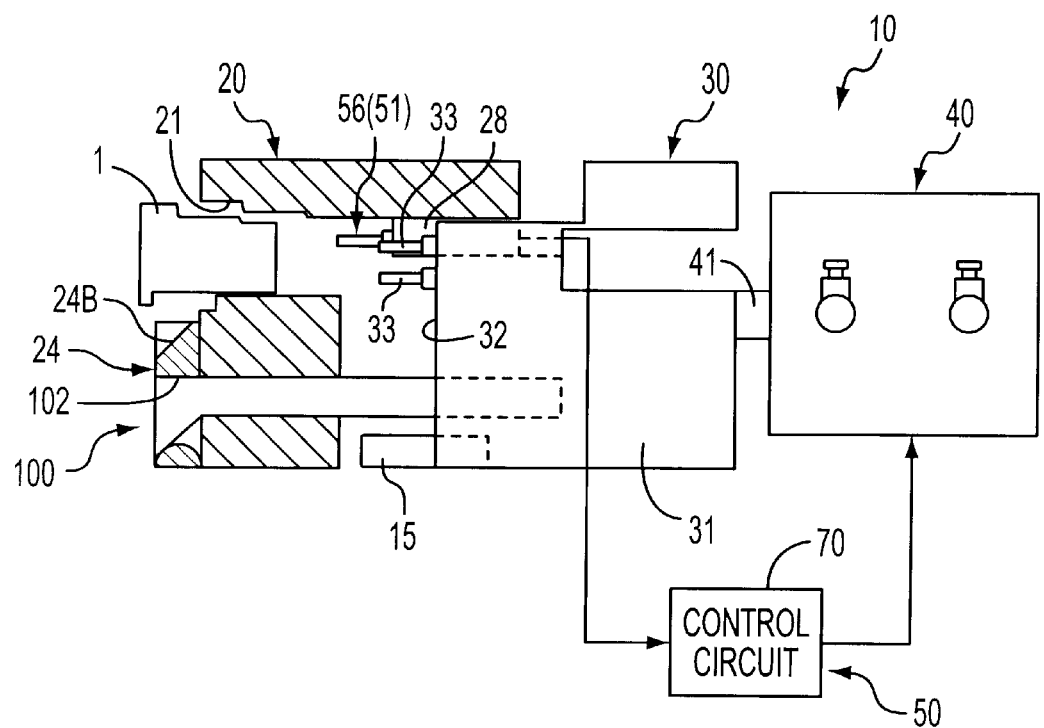
FIG. 4(A) is a schematic sectional elevation view of the auto-lock type continuity test unit in FIG. 1, which represents a condition in a retracted state.
Figure 4B:
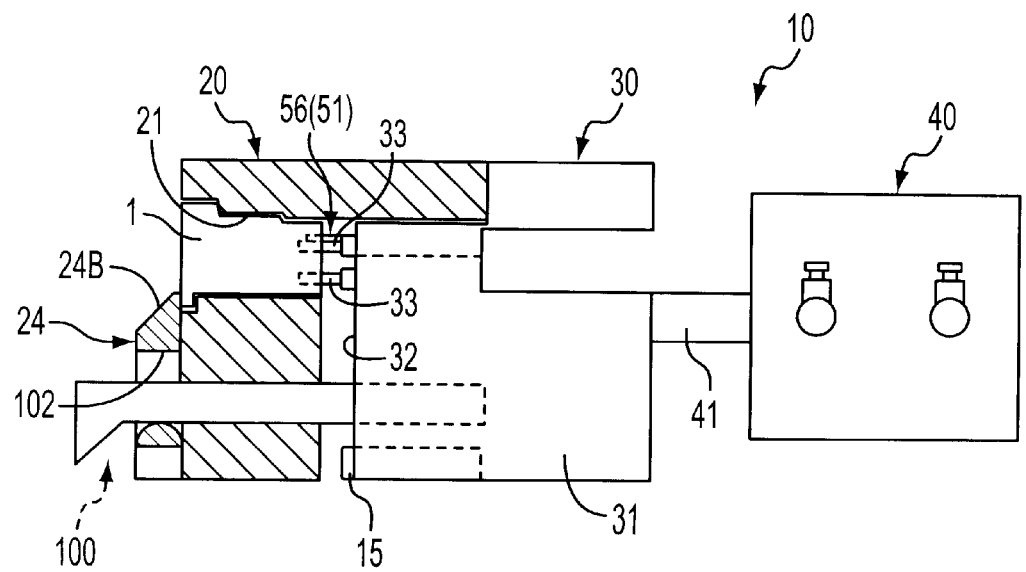
FIG. 4(B) is a schematic sectional elevation view of the auto-lock type continuity test unit in FIG. 1, which represents a condition in an engaged state.

A test area 30 is arranged between the rear of the main body 12 of the outer plate 11 and the connector receiving member 20, and is provided with a movable block 31 made of resin which is mounted for movement in the fore and aft directions for engaging and disengaging from the connector receiving member 20, by a rail member 15 (refer to FIGS. 4(A) and 4(B)) fastened to the outside plate 11. A plurality of probe pins 33 project from the forward facing surface 32 of the movable block 31 toward the connector receiving member 20.

A step 31A is formed at the front of the upper end area of the movable block 31, and is engageable with a projection 20B of the connector receiving member 20. In addition, at the center of step 31A, a groove 31B is provided to avoid interference with a rib 28 formed on the above-mentioned projection 20B (FIG. 2).

Each probe pin 33 is provided to cooperate with a respective terminal T (only one terminal is shown in FIG. 1) of the connector housing 1 which is to be inserted within the insertion opening 21. Each of the pins 33 project to contact a corresponding terminal fitting T arranged in the insertion opening 21 of connector receiving member 20. In addition, the base of each probe pin 33 is connected with a known test device (not illustrated) via wiring (also not illustrated) allowing the above-mentioned test device to test the electrical continuity condition of the corresponding terminal fittings T. In this case, for the probe pins illustrated here, a 1 probe-form or 2 probe-form (which are well known in the prior art) may be selected according to the type of connector housing 1 which is subject to testing.

In reference to FIGS. 4(A) and 4(B), in order to shift the movable block 31 of the test area 30 between a disengaged state and an engaged state, an air cylinder 40 is provided as a drive mechanism which is arranged between the rear of the main body 12 and the movable block 30 inside the main body 12 and is fixed to the rear of main body 12. A rod 41 of air cylinder 40 is fixed to the movable block 31, and with rod 41 contracted, the movable block 31 shifts to a disengaged state, while with the rod 41 extended, the movable block 31 shifts to an engaged state. Accordingly, by setting a push-in load by the air cylinder and a pressure tight load to a predetermined value, continuity tests can be made without any inconvenience even if the probe pin 33 of the check area 30 is of a so-called 2 probe-form.

Furthermore, a sequencer 50 controls the air cylinder 40 and contains a spring pin unit 51 in an insertion opening 21 of connector receiving member 20 and a control circuit 70 for controlling the supply of pressurized air to the above-mentioned air cylinder 40 by connection of spring pin unit 51.

Figure 5:
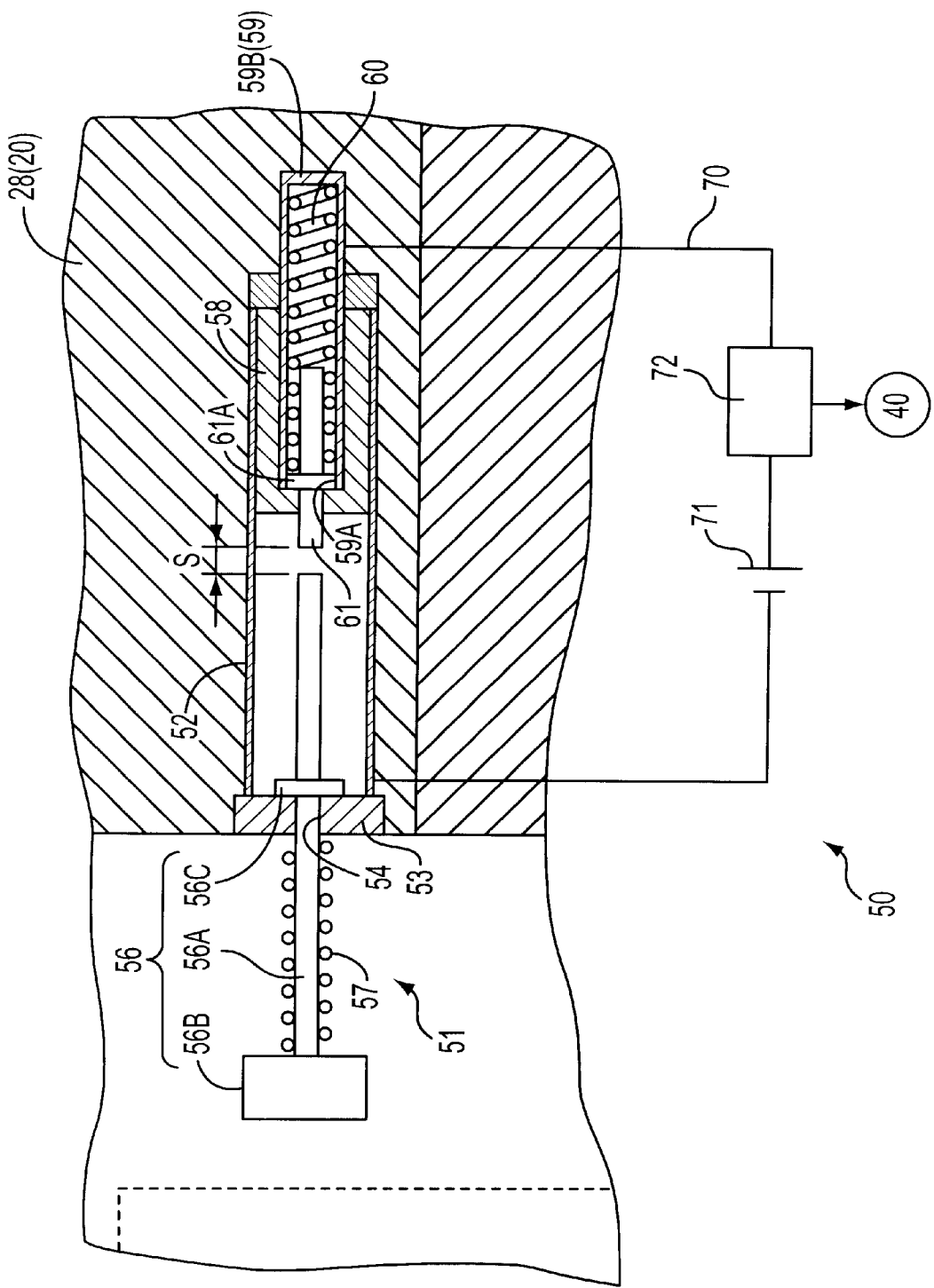
FIG. 5 is a partial cross-section view of a sequencer built in the auto-lock type continuity test unit in FIG. 1, along with a circuit structure diagram.

FIG. 5 is a partial cross-sectional view of a sequencer 50 which is built in the auto-lock type continuity test unit in FIG. 1. As shown in FIG. 5, the spring pin unit 51 includes a body 52 recessed within the rib 28 which is formed on the connector receiving member 20. The body 52 is a tubular member formed of an elastic material and is provided with a flange 53 on the outer end.

A contact 56 is slidably mounted within an aperture hole 54 in the flange 53. The contact 56 includes a cylindrical main body 56A, on part of which slides in the aperture 54, a flange 56B integrally formed on the outer end of the main body 56A, which is formed of a conductive material, is equipped with a stop flange 56C which is press fit onto the main body 56A on the opposite side of flange 56B with respect to the aperture 54.

In addition, between the above-mentioned flange 56B and the flange 53, a compression coil spring 57 is installed under a compression. A control force (for example, 1 kgf/mm) of the compression coil spring 57 constantly biases the contact 56 in a direction towards the connector 1. The distance the pin 56 projects from the rib 28 is controlled by engagement of the stop flange 56C with the flange 53.

A boss cylinder 58 formed of insulation material is press fit within tubular body 52, and on the internal surface of this boss cylinder, a sleeve 59, formed of conductive material and having a bottom 59B, is press fit to a position in which the open end 59A is somewhat contracted by boss cylinder 58. The sleeve 59 projects toward the opposite side such that open end 59A is oriented toward the contact 56.

Inside of the sleeve 59 a compression coil spring 60 is incorporated, and one end thereof engages the bottom 59B of sleeve 59. This compression coil spring 60 is provided with a comparatively weak control force (for instance, 0.3 kgf/mm) compared with the above-mentioned compression coil spring 57.

The other end of the compression coil spring 60 engages a base end of a contact 61. The contact 61 is a cylindrical member formed of a conductive material, and is provided substantially at the middle with a flange 61A fixed thereto which slides inside the sleeve 59. The outer tip of contact 61 is spaced from the contact 56 via a predetermined gap S.

Furthermore, in the embodiment in FIG. 1, the tubular body 52 and the sleeve 59 are electrically connected to a control circuit 70. The control circuit 70 contains an electric source 71 and a driving device 72 which drives an air cylinder 40 which is constructed and arranged to drive the air cylinder 40 in a manner to be described later in detail. In addition to the above drive device 72, a display member (not shown), which is activated by being connected between contact 56 and contact 61 of the spring pin unit 51, allows visible detection of the existence of connector housing 1 within connector receiving member 20.

In addition, in the embodiment as shown in FIG. 1, an interlocking mechanism 100 is provided for interlocking a shift of the movable block 32 of test area 30 and a shift of the slide 24 which retains the connector housing within the connector receiving member 20. Interlocking mechanism 100 as shown in FIGS. 1, 2, 4(A) and 4(B) is formed by a link rod 101 which projects from the movable block 31 and by a cam hole 102 which is formed in the slide 24 and which is engaged by the link rod 101.

The link rod 101 has a base end fastened to the movable block 31 and an outer end 103 which enters into the cam hole 102 and is slidably received within the connector receiving member 20. The outer end 103 of link rod 101 is formed in a generally hook shape and has a chamfered cam surface 103A which is formed on its lower surface that slants downwardly.

On the other hand, a semicircular rib 104 which slides on the cam surface 103A of the link rod 101 is formed on the lower face of the cam hole 102 as seen in FIG. 2. Since the slider 24 is biased toward the connected state by the compression coil springs 26 through the arms 24A, the semicircular rib 104 always contacts the cam face 103A of the link rod 101.

As shown in FIG. 4(A), when the movable block 31 shifts to a retracted condition, the cam surface 103A of the link rod 101 pushes down on the semicircular rib 104. Therefore, the slider 24 shifts to the release condition for opening the insertion opening 21 of the connector receiving member 20. On the other hand, as shown in FIG. 4(B), when the movable block 31 shifts to an engaged condition, the end of the link rod 101 projects from the cam hole 102 and permits the semicircular rib 104, and hence the slider 24, to rise. Therefore, the slider 24 shifts to a retaining condition for retaining the connector housing 1 by obstructing the insertion opening 21 of the connector receiving member 20. The interlocking mechanism 100 of the embodiment of FIG. 1 is configured so that the slider 24 and the test unit cooperate to permit the insertion of the connector housing 1 into the connector receiving member 20 while the slider 24 is maintained in the release condition at the initial state.

The operation of the continuity test unit 10 in the above-mentioned embodiment is described as follows with reference to FIGS. 4(A) and 4(B).

With the above-mentioned structure, when a worker inserts the connector housing 1 into the connector receiving member 20, the connector housing 1 can be inserted by relatively shifting the connector receiving member 20 and the test unit 30 to a separated state without interference of the probe pins 33 of the test unit 30 with the terminal fittings T of the connector housing 1 as shown in FIG. 4(A). When the connector housing 1 is inserted, it engages with the projecting contact 56 of the spring pin unit 51, which is part of the sequencer 50 of the interlocking mechanism, and the contact 56 is depressed. Therefore, the projecting contact 56 connects with the contact 61 (shown in FIG. 5) to complete control circuit 70 which operates driving the drive unit 72 and causes the rod 41 of the air cylinder 40 to extend. In this manner, the sequencer 50 causes the test unit 30 to shift to the engaged state due to the insertion of the connector housing 1 into the connector receiving member 20, and the test unit 30 engages the connector housing 1 which is retained in position by slider 24 and carries out the predetermined continuity test.

In this connection, in the example shown in FIGS. 1–5, the interlocking mechanism 100 controls the opening and closing motion of the slider 24 which is carried out in response to the relative movement of the connector receiving member 20 and the test unit 30. When the worker inserts and extracts the connector housing 1, the slider 24 is positioned in a release state, and when the test unit 30 performed the continuity test, the slider 24 is positioned in the retaining condition, therefore the connector housing 1 is tightly fixed in place.

Furthermore, the sequencer 50 controls the air cylinder 40 by a fixed timing, for example, after completion of the continuity test, and returns the connector receiving member 20 and the test unit 30 to the relative separated condition. Thus, the worker can easily extract the connector housing 1 from the connector receiving member 20.

The mechanism for providing the above-mentioned timing to the sequencer 50 can be achieved, for example, by a timer which is installed in the control circuit 70, and the test result signal of the continuity test unit 10 in which the probe pins 33 are connected (not shown in the figures) is sent to the control circuit 70 as a trigger, for example. Furthermore, a continuity test of a plurality of connector housings 1 adapted for testing a wire assembly can be carried out by engagement with a plurality of the continuity test units on a board. When it is apparent that some of the connector housings 1 have defects as a result of the continuity test, the control circuit may be configured to provide a failure treatment by returning only the continuity test unit 10 which corresponds to the defective connector housing 1 to the initial state as shown in FIG. 4(A).

When the test unit 30 returns from the engaged condition to the separated condition, the slider 24 shifts from the retaining condition and shifts to the released condition. Accordingly, the connector housing 1 is released. In the embodiment shown in FIGS. 1–5, the compression coil spring 57 is an elastic body for biasing the inserted connector housing 1 toward the removal direction, wherein the connector housing 1 in a free state is ejected from the insertion opening 21 by the biasing force of the spring, as shown in FIG. 4(A). Then, as the compression coil spring 57 is positioned at the connector insertion area 20 and made to be movable relative to the test area 30, the biasing force of the compression coil spring 57 can be established at a level (for example, 1 kgf/mm) sufficient to push the connector housing 1 out of the connector receiving member 20.

As illustrated in the foregoing embodiment of the present invention, when a worker inserts the connector housing 1 into the connector receiving member 20, the insertion of the connector housing 1 is carried out without interference of the probe pins 33 of the test unit with the terminal fittings T of the connector housing 1. Therefore, the connector housing 1 can be easily inserted into the connector receiving member 20, regardless of the type of the probe pins 33 utilized in the test unit. Thus, according to the present invention, as 1 probe-forms and 2 probe-forms can be easily utilized, with the remarkable effect that restriction of the probe pins 33 to a particular type is reduced.

Particularly, as the interlocking mechanism 100 for linking the slider 24 with the air cylinder 40 is operated, the slider 24 opens and closes automatically. Therefore, there is an advantage that the worker can carry out the continuity testing, irrespective of the slider 24.

In addition, as the interlocking mechanism 100 of the embodiment shown in FIG. 1 permits the insertion of the connector housing 1 into the connector receiving member 20 while keeping the slider 24 in the release state at the initial state, the connector housing 1 can be easily inserted into the connector receiving member 20, and as a result, there is an advantage that workability is improved.

Furthermore, when the compression coil spring 57 for biasing the inserted connector housing 1 toward the extraction direction is provided for the connector receiving member 20, the biasing force can be established at a level (for example, 1 kgf/mm) sufficient to push the connector housing 1 out of the connector receiving member 20. Therefore, when the connector housing 1 is pushed out of the connector receiving member 20 by the compression coil spring 57, the compression coil spring 57 which enables the connector housing 1 to be most easily inserted is selected and, as a result, there is an advantage that workability is improved.

The above-mentioned embodiment exemplifies only the preferred embodiment, but the present invention is not limited thereto. FIGS. 6(A)–6(D) are schematic cross-sectional views showing the operation of the continuity test unit 10 in a second embodiment of the present invention. Furthermore, the same reference numerals are given to the same elements as in the embodiment of FIG. 1 in the discussion which follows.

Figure 6A:
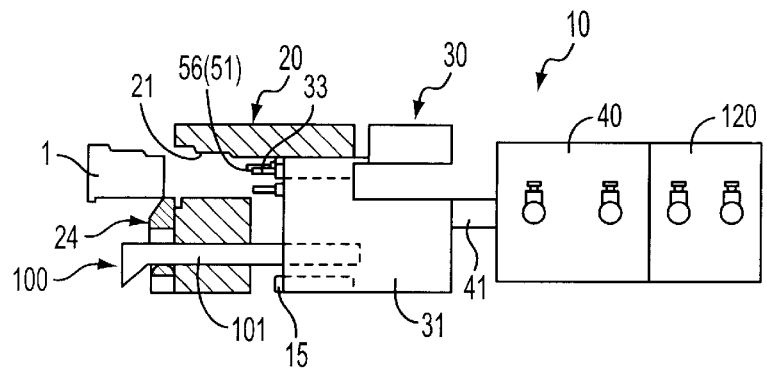
FIGS. 6(A)–6(D) are schematic sectional drawings showing an operating continuity test unit in a second embodiment.

Referring to FIGS. 6(A)–6(D), the interlocking mechanism 100 of the embodiment shown utilizes a link rod 101, a semicircular rib 104 of slider 24, and other elements as in the embodiment in FIG. 1, but the initial position of link rod 101 is changed, and the slider 24 is maintained in the connected state in the initial state as shown in FIG. 6(A). The slider 24 cooperates with the link rod 101 of test unit 30 so that the slider 24 is permitted to be pushed in. Furthermore, at the same time, an interlocking air cylinder 120, which can be driven independently of the air cylinder 40, is included.

Figure 6B:
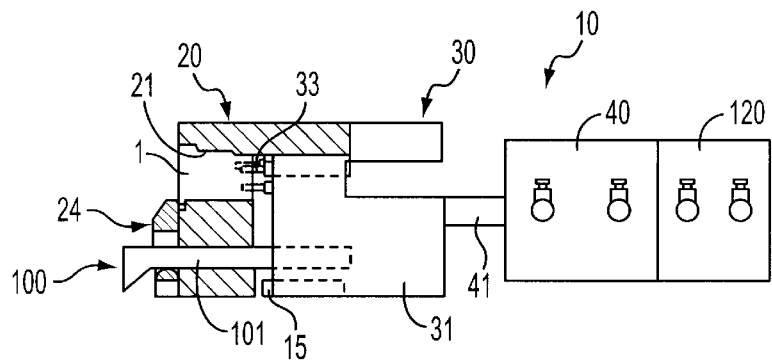
Figure 6C:
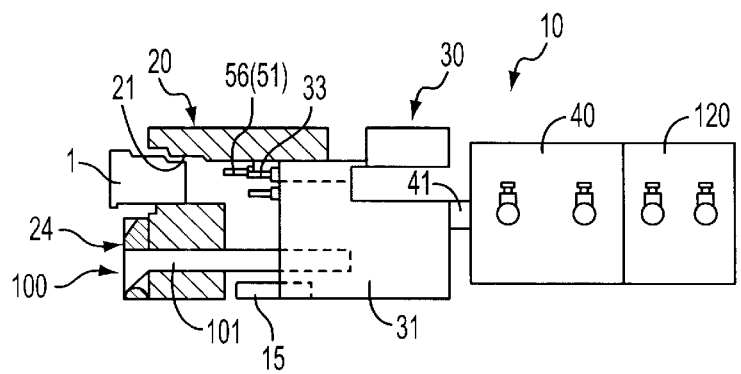
Figure 6D:
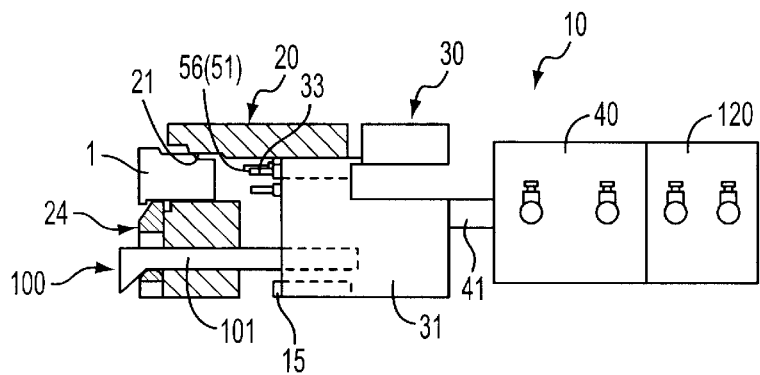

The interlocking air cylinder 120 extends the rod 41 separately from the air cylinder 40 in the initial state shown in FIG. 6(A) and in the continuity test shown in FIG. 6(B). On the other hand, as shown in FIG. 6(C), after the interlocking air cylinder 120 contracts in synchronization with the air cylinder 40 when the air cylinder 40 extends once and then contracts, the air cylinder 120 extends the rod 41 again independently of the air cylinder 40 after the lapse of a fixed period of time as shown in FIG. 6(D), and the interlocking air cylinder 120 is operated to return to the initial position. The above-mentioned fixed period of time T can easily be established, for example, by adapting a timer into the sequencer 50.

With this embodiment, as shown in FIG. 6(A), because slider 24 is maintained in a connected state at the initial state, a worker inserts a connector housing 1 into a connector receiving member 20 by pushing the connector housing and thereby displacing the slider 24 from the connected state to a released state. Therefore, unless the connector housing 1 is completely inserted in the connector receiving member 20, the slider 24 does not shift to the connected state from the expanded condition. Different from the embodiment in FIG. 1, where slider 24 automatically locks the connector housing 1, the switch function (power source 71 and drive device 72) of spring pin unit 51 is omitted.

Figure 7:
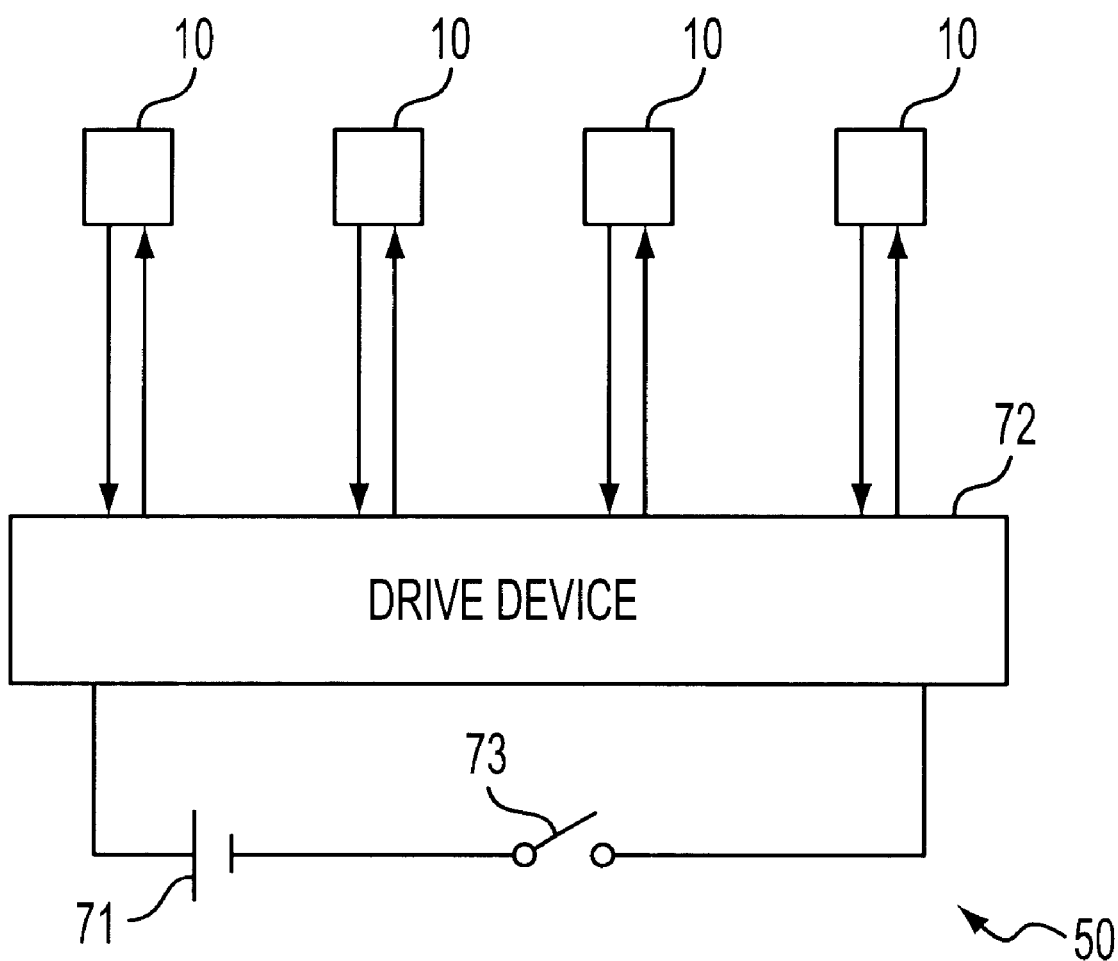
FIG. 7 is a diagram showing a schematic structure of the control device relating to the embodiment of FIG. 6.

FIG. 7 is a diagram showing a schematic structure of a control device 50 in relation to the embodiment of FIGS. 6(A)–6(D). As mentioned above, in the embodiment in FIGS. 6(A)–6(D), because the switching function of the spring pin unit 51 is omitted, and each continuity check unit 10 is operated at a predetermined timing, a control device 50 employing a manual switch 73 is provided. Since the driving device 72 in the control device 50 allows each continuity test unit 10 to be driven simultaneously, each continuity test unit 10 operates in response to this control device 50 as follows.

First, when a connector housing 1 is completely inserted, a continuity test is carried out by operating the switch 73 (refer to FIG. 6(B)), and after the test, it returns to the home position (refer to FIG. 6(D)) after an elapse of a predetermined prior of time T by having been contacted in harmony with the air cylinder 40 (refer to FIG. 6(C)). During this period, an interlocking mechanism 100 fastens the connector housing 1 when testing, and then by setting the above predetermined time and shifting to a released state at a removal timing (as shown in FIG. 6(C)) when both air cylinders 40 and 120 retract the rod 41, the slider 24 releases the connector housing 1 to a free condition. Then, after the above predetermined time, the slider 24 returns to a connected state after the connector housing 1 is pushed out by a control force of compressed coil spring 57 provided on the contact 56 of the spring pin unit 51. At least a portion of the connector housing 1 is pushed out from the insertion opening 21 before the slider 24 shifts. Therefore, as shown in FIG. 6(D), the connector housing 1 can be extracted without being locked again by the slider 24.

When adopting this embodiment, because the slider 24 is not shifted to a connected state unless the connector housing 1 is completely inserted into the connector receiving member 20, a worker can make sure, by visually observing the shift of slider 24, whether or not the connector housing is completely inserted into the connector receiving member 20, thereby providing the advantage of confirming the reliability of operation.

On the other hand, providing a two-step air cylinder allows the connector housing 1 to be inserted without requiring the spring pin unit 51 to contact the connector housing 1 as a result of not being given the control force of the compression coil spring 57 at insertion, thereby also making it possible to increase the control force of compression coil spring to a level as high as possible.

Figure 8A:
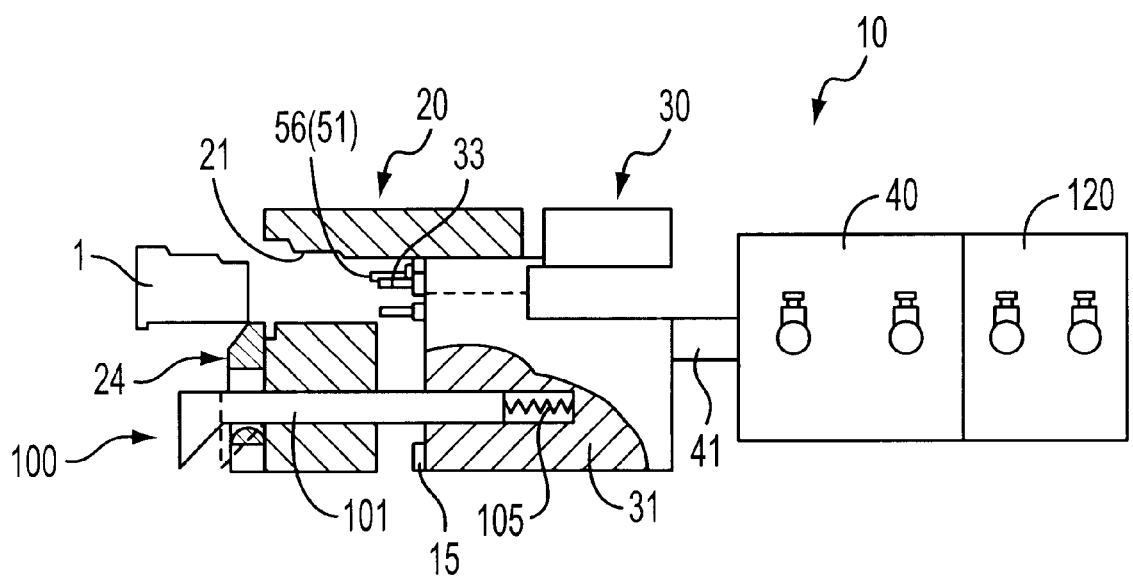
FIG. 8(A) is a schematic sectional drawing showing a schematic section drawing of the initial connection of a third embodiment of the invention.
Figure 8B:
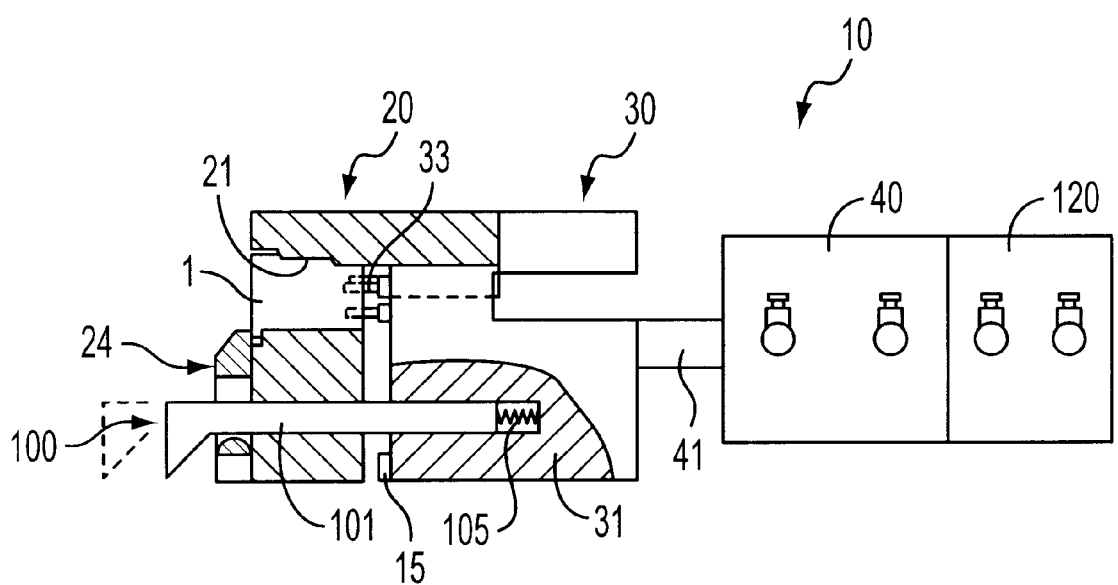
FIG. 8(B) is a schematic section drawing at testing, of the embodiment depicted in FIG. 8(A).

FIGS. 8(A) and 8(B) depict a third embodiment of the invention, and show a modified example of the embodiment of FIGS. 6(A)–6(D), wherein FIG. 8(A) shows a schematic cross-section during insertion and FIG. 8(B) shows a schematic cross-section at testing.

In FIGS. 8(A) and 8(B), a link rod 101 and a movable block 31 are mounted for relative movement and a compression coil spring 105 engages therebetween. Thus, pushing the link rod 101 to the position shown by the broken line from the initial condition shown with a full line in FIG. 8(A), a structure is made which enables the slider 24 to be shifted to a released state even when the movable block 31 is in the initial position. However, when this structure is adopted, during testing, a greater force is acting in a direction of extraction from an insertion opening 21 against the connector housing 1, and it is necessary the slide 24 does not inadvertently release the connector housing 1.

Therefore, in the embodiment as illustrated in FIG. 8(B), even when the link rod 101 is inserted as shown in a solid line from the state shown with a broken line at testing, the cam shape or the amount of movement is controlled so that the slide 24 will not be released.

With the structure as illustrated in FIGS. 8(A) and 8(B), there are advantages of being able to manually release the connector housing in the initial condition with the safety of a worker assured.

With any of the embodiments mentioned above, the relative movement of the connector receiving member 20 and testing area 30 may be provided by any structure in which one is fastened and the other is movable or both of them are movable.

In addition, the continuity test unit 10 is not limited to a recessed type alone. Moreover, various design alternatives within the scope of the patent claims of the present invention are possible.

Although the invention has been described with reference to particular means, materials and embodiments, it is to be understood that the invention is not limited to the particulars disclosed and extends to all equivalents within the spirit and scope of the claims.

The present disclosure relates to subject matter contained in priority Japanese Application No. HEI 9-39448, filed on Feb. 24, 1997, which is herein expressly incorporated by reference in its entirety.

What is claimed:

1. An auto-lock type continuity test unit, comprising:
    a connector receiving member that receives a connector housing having terminal fittings, said connector housing being slid in a first direction through an opening in said connector receiving member to become a test object, the connector housing being automatically held in said connector receiving member upon insertion of the connector housing into said connector receiving member during a testing operation;
    a test area that contains probe pins for continuity testing of the terminal fittings, said probe pins being selectively inserted into the connector receiving member to engage with the terminal fittings; and
    a connecting mechanism associated with said connector receiving member that selectively shifts, in a second direction different than said first direction, to a connected state for connecting said connector housing inserted into said connector receiving member and to a released state to permit removal of the connector housing from the connector receiving member;
    a driving mechanism capable of relatively shifting said connector receiving member and said testing area between an engaged condition and a separated condition; and
    a control mechanism which, upon insertion of the connector housing into said connector receiving area, controls said driving mechanism in such a manner that both said connector receiving member and said test area automatically shift to said engaging condition and both said connector housing receiving member and said test area shift to said separated condition after a predetermined time period.

2. An auto-lock type continuity check unit as set forth in claim 1, further comprising:
    an interlocking mechanism that interlocks said connecting mechanism with said driving mechanism.

3. An auto-lock type continuity check unit as set forth in claim 2, wherein said interlocking mechanism comprises:

a link member that links said connecting mechanism and said test area so that said interlocking mechanism allows insertion of said connector housing into said connector receiving member by maintaining said connecting mechanism in said released state.

4. An auto-lock type continuity check unit as set forth in claim 2, wherein said interlocking mechanism comprises:

a link member that links said connecting mechanism and said test area so that said interlocking mechanism allows said connecting mechanism to be maintained in a connected state in an initial condition and also allows the connecting mechanism to be pressed to said released state by the connector housing which is inserted into said connector receiving member.

5. An auto-lock type continuity check unit as set forth in claim 4, wherein said link member is connected in a relatively shiftable manner to said test areas so as to allow said connecting mechanism to shift between said released state and said connected state.

6. An auto-lock type continuity check unit as set forth in claim 1, further comprising:

an elastic body which biases an inserted connector housing in a removal direction.

7. An auto-lock type continuity check unit as set forth in claim 2, further comprising:

an elastic body which biases an inserted connector housing in a removal direction.

8. An auto-lock type continuity check unit as set forth in claim 3, further comprising:

an elastic body which biases an inserted connector housing in a removal direction.

9. An auto-lock type continuity check unit as set forth in claim 4, further comprising:

an elastic body which biases an inserted connector housing in a removal direction.

10. An auto-lock type continuity check unit as set forth in claim 5, further comprising:

an elastic body which biases an inserted connector housing in a removal direction.

11. An auto-lock type continuity test unit, comprising:

a connector receiving member that receives a connector having terminal fittings, said connector being slid in a first direction through an opening in said connector receiving member to be tested;

a test area having contacting elements that selectively engage the terminal fittings, said test area, in an initial spaced condition, being spaced from said connector receiving member;

a connecting mechanism associated with said connector receiving member movable, in a second direction different than said first direction, between a first position, capable of automatically retaining the connector within said connector receiving member during a testing operation, and a second position, permitting removal of the connector;

said connector receiving member and said test area being relatively movable such that at least one of said connector receiving member and said test area is movable from said initial spaced condition to an engaged position, wherein said contacting elements of said test area are positioned to engage the terminal fittings of the connector housing;

an actuating mechanism that selectively interconnects said test area and said connecting mechanism, said actuating mechanism being capable of moving said connecting mechanism to said second position permitting removal of said connector housing when said connector receiving member and said test area are positioned in said initial spaced condition and capable of permitting movement of said connecting mechanism to said first retaining position upon movement of said connector receiving member and said test area to said engaged position.

12. An auto-lock type continuity test unit as set forth in claim 11, further comprising a driving mechanism for moving said connector receiving member and said test area between the initial spaced condition and the engage position.

13. An auto-lock type continuity test unit as set forth in claim 12, further comprising a control mechanism responsive to insertion of said connector housing into said connector receiving member for actuating the driving mechanism to move said connector receiving member and said test area to said engaged position.

14. An auto-lock type continuity test unit as set forth in claim 13, wherein said control mechanism is configured to actuate the driving mechanism after a predetermined time period to move said connector receiving member and said test area to the initial spaced condition.

15. An auto-lock type continuity test unit as set forth in claim 13, wherein said control mechanism further comprises a biasing member for ejecting the connector housing from said connector receiving member when said connecting mechanism is in the second position.

16. An auto-lock type continuity test unit as set forth in claim 13, further comprising a biasing member for ejecting the connector housing from said connector receiving member when said connecting mechanism is in the second position.

17. An auto-lock type continuity test unit, comprising:

a connector receiving member that receives a connector having terminal fittings, said connector being inserted into said connector receiving member to be tested;

a test area having contacting elements that selectively engage the terminal fittings said test area, in an initial spaced condition, being spaced from said connector receiving member;

a connecting mechanism associated with said connector receiving member movable between a first position capable of retaining the connector housing within said connector receiving member during a testing operation and a second position, permitting removal of the connector housing, said connector receiving member and said test area being relatively movable such that at least one of said connector receiving member and said test area is movable from said initial spaced condition to an engaged position, wherein said contacting elements of said test area are positioned to engage the terminal fittings of the connector housing;

an actuating mechanism that selectively interconnects said test area and said connecting mechanism, said actuating mechanism being capable of moving said connecting mechanism between said second position and said engaged position; and a test board having a substantially planar surface, wherein said connector receiving member has an outer surface positioned in substantially the same plane as said surface of said test board.

* * * * *

UNITED STATES PATENT AND TRADEMARK OFFICE
CERTIFICATE OF CORRECTION

PATENT NO. : 6,157,197
DATED : December 5, 2000
INVENTOR(S) : J. Iwasaki

It is certified that error appears in the above-identified patent and that said Letters Patent is hereby corrected as shown below:

Column 13,
Line 18 (claim 5, line 4), "areas" should be -- area, --.

Column 14,
Line 40 (claim 17, line 6), after "fittings" insert -- , --.
Line 44 (claim 17, line 10), after "position" insert -- , --.
Line 46 (claim 17, line 12), after "operation" insert -- , --.

Signed and Sealed this

Thirteenth Day of November, 2001

Attest:

NICHOLAS P. GODICI
Attesting Officer    Acting Director of the United States Patent and Trademark Office